United States Patent
Yoshikawa

(10) Patent No.: US 7,113,357 B2
(45) Date of Patent: Sep. 26, 2006

(54) SEMICONDUCTOR DEVICE AND A DISK DRIVE APPARATUS EMPLOYING SUCH A SEMICONDUCTOR DEVICE

(75) Inventor: Hiroshi Yoshikawa, Kyoto (JP)

(73) Assignee: Rohm Co., LTD, Kyoto (JP)

(*) Notice: Subject to any disclaimer, the term of this patent is extended or adjusted under 35 U.S.C. 154(b) by 0 days.

(21) Appl. No.: 11/033,309

(22) Filed: Jan. 12, 2005

(65) Prior Publication Data
US 2005/0122611 A1 Jun. 9, 2005

Related U.S. Application Data

(62) Division of application No. 09/247,552, filed on Feb. 10, 1999, now Pat. No. 6,859,423.

(30) Foreign Application Priority Data

Feb. 12, 1998 (JP) .............................. H10-29767
Dec. 17, 1998 (JP) .............................. H10-358602

(51) Int. Cl.
*G11B 5/09* (2006.01)
(52) U.S. Cl. ......................... 360/46; 360/75
(58) Field of Classification Search .................. 360/46, 360/75, 25, 77.02; 710/302
See application file for complete search history.

(56) References Cited

U.S. PATENT DOCUMENTS

| 4,031,448 A | 6/1977 | Adachi ....................... 318/696 |
| 4,626,750 A | 12/1986 | Post ........................... 318/139 |
| 4,652,806 A | 3/1987 | Aiello ......................... 318/696 |
| 4,897,778 A | 1/1990 | Miyamoto et al. .......... 318/599 |
| 4,967,291 A | 10/1990 | Touchton et al. ......... 360/78.04 |
| 5,246,479 A | 9/1993 | Gami et al. ............... 360/73.03 |
| 5,572,099 A | 11/1996 | Carobolante ................ 318/434 |
| 5,625,777 A * | 4/1997 | Takahashi et al. .......... 710/302 |
| 5,630,008 A | 5/1997 | Okuyama et al. ........... 388/804 |
| 5,721,838 A * | 2/1998 | Takahashi et al. .......... 710/302 |
| 5,777,815 A * | 7/1998 | Kasiraj et al. ................ 360/75 |
| 6,011,375 A | 1/2000 | Korbel et al. ............... 318/599 |
| 6,122,131 A * | 9/2000 | Jeppson .................... 360/77.02 |
| 6,141,173 A * | 10/2000 | Kitazaki et al. .............. 360/75 |
| 6,178,053 B1 * | 1/2001 | Narita .......................... 360/25 |

FOREIGN PATENT DOCUMENTS

| JP | 2-182083 | 7/1990 |
| JP | 09-027955 | 1/1997 |
| JP | 62-222777 | 9/1997 |
| JP | 2000-138845 | 5/2000 |

\* cited by examiner

*Primary Examiner*—Fred F. Tzeng
(74) *Attorney, Agent, or Firm*—Arent Fox PLLC

(57) ABSTRACT

When a circuit that is likely to cause noise is enabled, a control circuit turns on a switch so that an inverter will be formed by one P-channel MOSFET and two parallel-connected N-channel MOSFETs. This helps enhance the current capacity of the inverter on its N-channel MOSFET side, and thereby lower the threshold voltage of the inverter.

7 Claims, 6 Drawing Sheets

SEMICONDUCTOR DEVICE AND A DISK DRIVE APPARATUS EMPLOYING SUCH A SEMICONDUCTOR DEVICE

CROSS-REFERENCE TO RELATED APPLICATIONS

This is a divisional of U.S. patent application Ser. No. 09/247,552, now U.S. Pat. No. 6,859,423, filed Feb. 10, 1999, which claims priority to foreign patent application no. H10-29767, filed Feb. 12, 1998 in Japan and foreign patent application no. H10-358602, filed Dec. 17, 1998 in Japan. The disclosures of all these applications are incorporated by reference herein in their entirety.

BACKGROUND OF THE INVENTION

1. Field of the Invention

The present invention relates to a semiconductor device and to a disk drive apparatus, such as a floppy disk drive (FDD), hard disk drive (HDD), PD drive, or CD-ROM (compact disk read-only memory) drive, that employs such a semiconductor device.

2. Description of the Prior Art

As an example of a disk drive apparatus, FIG. 5 shows a block diagram of an FDD (floppy disk drive) apparatus. In this figure, reference numeral 1 represents an interface driver circuit; 2 represents a control circuit; 3 represents a read/write circuit; 4 represents a stepping motor driver circuit; 5 represents a spindle motor driver circuit; 6 represents a read/write head; 7 represents an erase head; 8 represents a stepping motor; 9 represents a spindle motor; 10 represents an index sensor; 11 represents a track sensor; and 100 represents an external host apparatus such as a personal computer. Of these elements, the interface driver circuit 1, control circuit 2, read/write circuit 3, and stepping motor driver circuit 4 are formed on a single-chip IC (semiconductor integrated circuit).

Having the above-noted elements, the FDD apparatus operates as follows. The interface driver circuit 1 serves to adjust the data format and the data transfer method between, on the one hand, the data exchanged between the host apparatus 100 and the control circuit 2, and, on the other hand, the data exchanged between the host apparatus 100 and the read/write circuit 3, i.e. the data that is going to be written to or has just been read from a magnetic disk (not shown).

The control circuit 2 receives data from the host apparatus 100 through the interface driver circuit 1, and, in accordance with that data, controls the writing and reading of the data to and from the magnetic disk (not shown). In return, the control circuit 2 feeds data indicating the operating condition of the FDD apparatus to the host apparatus 100 through the interface driver circuit 1.

Under the control of the control circuit 2, the read/write circuit 3, during data writing, feeds the coils of the read/write head 6 (used to write and read data to and from the magnetic disk) and of the erase head 7 (used to erase data from the magnetic disk) with electric currents in accordance with the data fed from the host apparatus 100 through the interface driver circuit 1, and thereby writes the data to the magnetic disk. On the other hand, during data reading, the read/write circuit 3, on the basis of the voltage that appears in the coil of the read/write head 6 in accordance with the data recorded on the magnetic disk, reads the data from the magnetic disk, and feeds the obtained data to the host apparatus 100 through the interface driver circuit 1.

The stepping motor driver circuit 4, under the control of the control circuit 2, drives the stepping motor 8 to transport the read/write head 6 and the erase head 7 radially across the magnetic disk. The spindle motor driver circuit 5, under the control of the control circuit 2, drives the spindle motor 9 to rotate the magnetic disk.

The index sensor 10 enables the control circuit 2 to detect whether the magnetic disk is rotating normally or not, and the track sensor 11 enables the control circuit 2 to detect whether the read/write head 6 and the erase head 7 are positioned at the outermost edge of the magnetic disk or not.

According to a conventional circuit design, the first stage of the input section of the interface driver circuit 1 is configured as shown in FIG. 6. Specifically, a P-channel MOSFET (metal-oxide semiconductor field-effect transistor) (hereafter referred to simply as a "PMOS transistor") Q1 and an N-channel MOSFET (hereafter referred to simply as an "NMOS transistor") Q2 constitute an inverter, and the input terminal I of this inverter is connected simultaneously to a pad P, to the node between a pull-up resistor R1 and a pull-down resistor R2 that are connected in series between the supply voltage $V_{CC}$ and the reference potential GND, and also to the node between two protection diodes Di1 and Di2 that are connected in series between the supply voltage $V_{CC}$ and the reference potential GND so as to be each reverse-biased. This circuit is formed within the IC (i.e. to the left of the broken line H).

Moreover, the threshold voltage of the inverter is set to be approximately equal to $V_{CC}/2$. As a result, when a low level is fed to the pad P, making the input of the inverter lower than $V_{CC}/2$, then the PMOS transistor Q1 is turned on, and the NMOS transistor Q2 is turned off, and thus the inverter outputs a high level ($V_{CC}$); by contrast, when a high level is fed to the pad P, making the input of the inverter higher than $V_{CC}/2$, then the PMOS transistor Q1 is turned off, and the NMOS transistor Q2 is turned on, and thus the inverter outputs a low level (ground level). The reason that the threshold voltage of the inverter is set to be approximately equal to $V_{CC}/2$, which is the middle value of the supply voltage $V_{CC}$, is that the threshold voltage should preferably be set to be approximately equal to the middle level between the high and low level fed to the pad P.

Here, note that the output section of the interface driver circuit 1, and also the stepping motor driver circuit 4, includes a circuit that handles a large current (such a circuit will hereafter be referred to as a "large-current driver"). Since such large-current drivers are formed on the same single chip as the input sections of corresponding or other circuits, they tend to cause undesirable phenomena as described below. One example is the variation of the supply voltage $V_{CC}$ that is caused every time a large-current driver is turned on or off. Another example is the voltage drop caused across the resistor R1 by the current (hereafter referred to as the "parasitic current"), indicated by K in FIG. 6, that flows through the resistor R1 and then through the diode Di2 as the result of an NPN-type parasitic transistor T2 being turned on when the level at the collector of an NPN transistor T1 included in a large-current driver drops below the ground level under the influence of the back electromotive force occurring in the motor driven by the large-current driver. The parasitic transistor 72 is, for example, so formed as to have its emitter at the collector of the above-mentioned NPN transistor T1 of the large-current driver, have its base at the P-type substrate connected to the ground level, and have its collector at the cathode of the protection diode Di2 of the input section. When either of these phenomena is present, the voltage fed to the inverter is lower than when none of them is present, even if the voltage that is fed to the pad P through a predetermined impedance is kept constant (such a drop in the voltage fed to the inverter will hereafter be referred to as an "input drop").

Inconveniently, according to the conventional configuration of the input section, if such an input drop occurs while the pad P is receiving a high level that is only slightly higher than the threshold voltage of the inverter, the level at the input of the inverter is very likely to drop below the threshold voltage, causing the PMOS transistor Q1 to be turned on, and thus causing the inverter to output a high level. This may lead to malfunctioning of the FDD apparatus as a whole.

Moreover, the nearer the input section is placed to the large-current driver, the larger the input drop. Accordingly, to prevent malfunctioning of the FDD apparatus as a whole, the layout within the IC chip needs to be worked out with strict restrictions so that input sections will not be placed adjacent to large-current drivers. This inevitably requires a larger chip area, and thus leads to an undesirable increase in the IC chip size as well as in its cost.

SUMMARY OF THE INVENTION

An object of the present invention is to provide a semiconductor device and a disk drive apparatus that are less prone to malfunctioning than ever and that are nevertheless satisfactorily compact and inexpensive.

To achieve the above object, according to the present invention, a semiconductor device is provided with: an output circuit; an input circuit that may read an input signal incorrectly depending on the output state of the output circuit; a control circuit for controlling the output circuit and for processing the input signal fed from the input circuit; and a threshold control circuit for varying the input threshold voltage of the input circuit in accordance with the output state of the output circuit.

According to this circuit design, for example in the case of the semiconductor device employed in the FDD apparatus described above as a conventional example, it is possible to lower the threshold voltage of the inverter of the input section whenever the large-current driver is enabled. This helps prevent incorrect reading of the input signal even in the event of a moderate (i.e. not extremely large) input drop.

BRIEF DESCRIPTION OF THE DRAWINGS

This and other objects and features of the present invention will become clear from the following description, taken in conjunction with the preferred embodiments with reference to the accompanying drawings in which.

DESCRIPTION OF THE PREFERRED EMBODIMENTS

Figure 1:
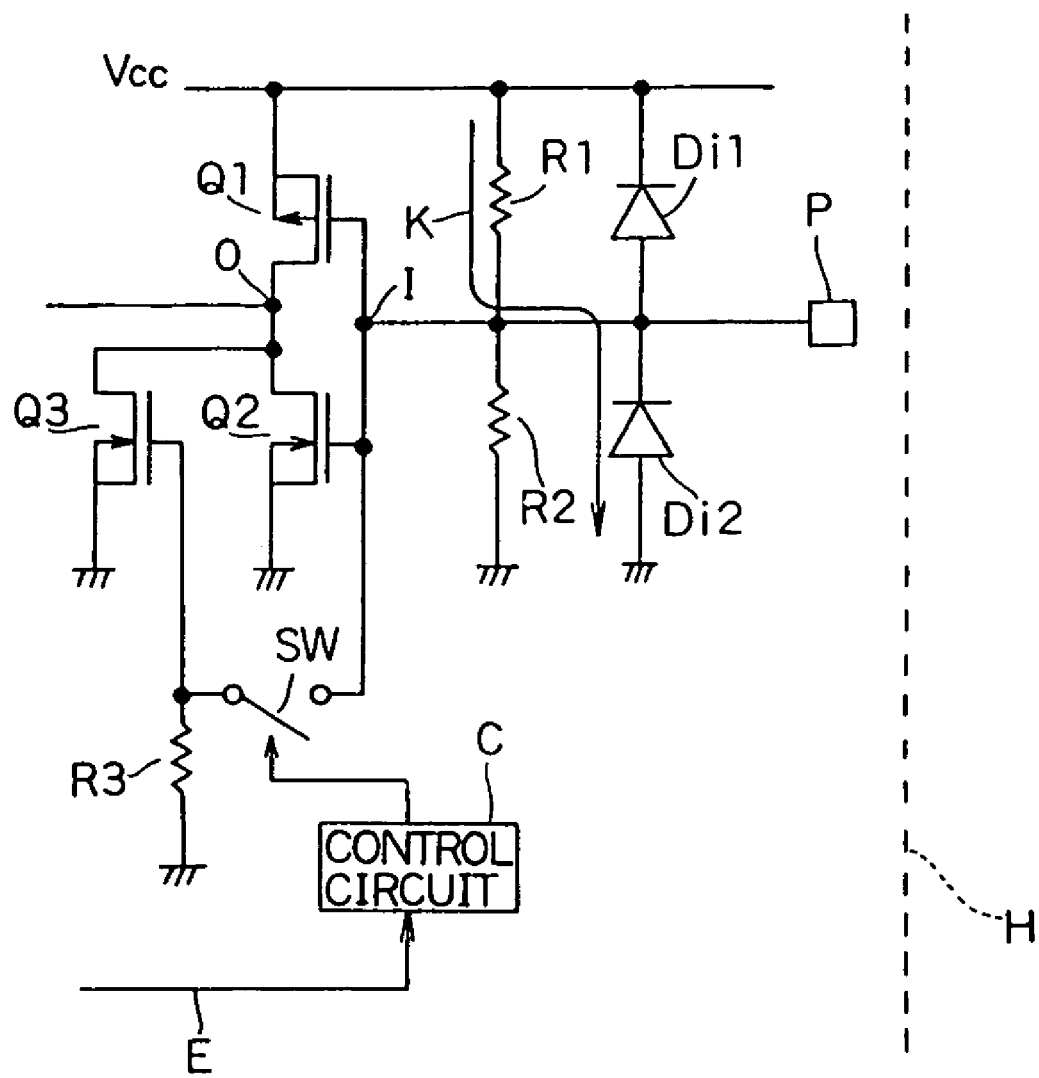
FIG. 1 is a circuit diagram of an example of the configuration of the input section of the interface driver circuit employed in an FDD apparatus embodying the invention.
Figure 5:
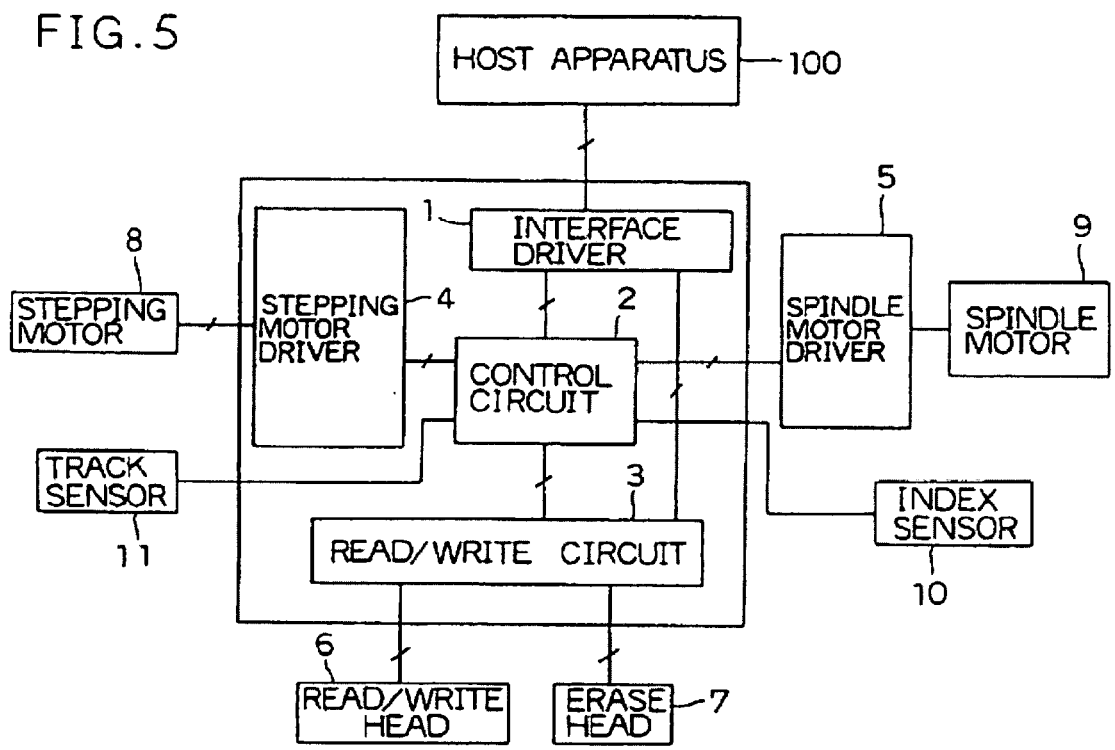
FIG. 5 is a block diagram of an FDD apparatus taken up as an example of a disk drive apparatus.
Figure 6:
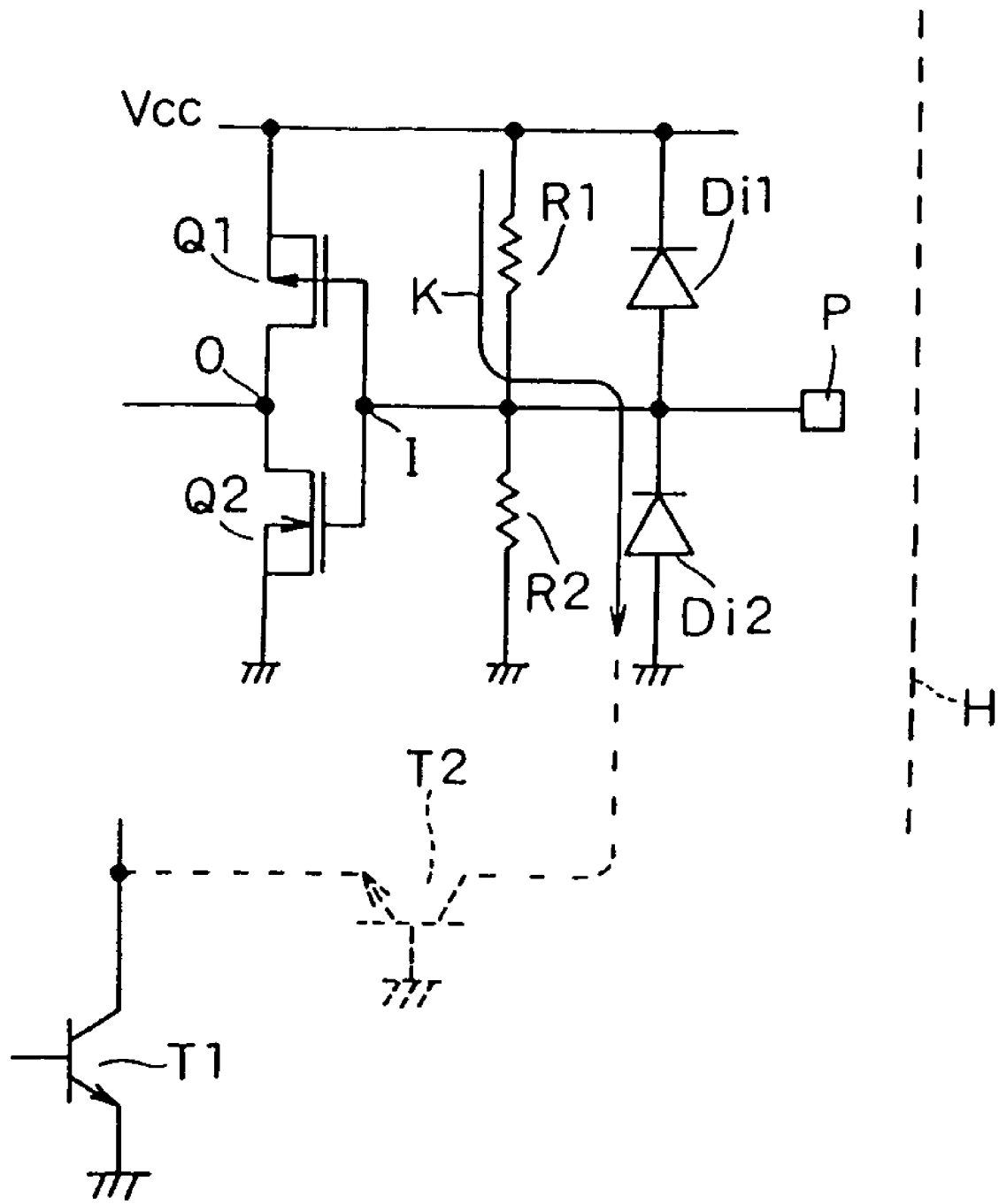
FIG. 6 is a circuit diagram of an example of the configuration of the input section of the interface driver circuit employed in a conventional FDD apparatus.

Hereinafter, embodiments of the present invention will be described with reference to the accompanying drawings. FIG. 1 shows the configuration of the first stage of the input section of the interface driver circuit 1 employed in an FDD apparatus embodying the invention. This circuit has an additional NMOS transistor Q3 of which the drain-source channel is connected in parallel with the drain-source channel of the NMOS transistor 2 and of which the gate is connected through a switch circuit SW to the gate of the NMOS transistor Q2 and simultaneously through a resistor R3 to the ground level. Note that, in FIG. 1, such elements as are found also in the conventional example shown in FIG. 6 are identified with the same reference symbols. Note also that the block diagram shown in FIG. 5 applies also to the FDD apparatus of the embodiment.

Having the configuration as described above, the circuit shown in FIG. 1 operates as follows. When the switch circuit SW is off, the gate of the NMOS transistor Q3 is at the ground level, and thus the NMOS transistor Q3 is kept off. In this state, an inverter is formed by the PMOS transistor Q1 and the NMOS transistor Q2 alone. By contrast, when the switch circuit SW is on, the gate of the NMOS transistor Q3 receives approximately the same voltage as the gate of the NMOS transistor Q2 receives. In this state, an inverter is formed by the PMOS transistor Q1 and the two parallel-connected NMOS transistors Q2 and Q3. As a result, at this time, the inverter has a higher current capacity on its NMOS transistor side, and thus has a lower input threshold voltage, than when the switch circuit SW is off.

Here, the turning on and off of the switch circuit SW is controlled by a control circuit C in accordance with an enable signal E that is issued to enable or disable a circuit such as a large-current driver that is likely to cause noise. Specifically, when the enable signal E is in a state that requests a noise-causing circuit to be enabled, the switch circuit SW is turned on, and, when the enable signal E is in a state that requests the noise-causing circuit to be disabled, the switch circuit SW is turned off. As a result, when the noise-causing circuit is enabled, the threshold voltage of the inverter is automatically made lower than when that circuit is disabled. Specifically, in such a case, the threshold voltage of the inverter is lowered by a voltage equal to that of a typical input drop.

Now, consider a case where a high level is fed to the pad P of the circuit shown in FIG. 1. If a noise-causing circuit is enabled at this moment, an input drop occurs as in the conventional configuration. Here, however, since the threshold voltage of the inverter is in such a case made lower than $V_{CC}/2$ by a voltage equal to that of a typical input drop, even if the inverter receives a high level that is lower than its normal threshold voltage $V_{CC}/2$ under the influence of a moderate input drop, there is no possibility of the input signal being read incorrectly. This makes it possible to reduce the possibility of malfunctioning of the FDD apparatus as a whole.

Incidentally, when the noise-causing circuit is disabled, the threshold voltage of the inverter is at its normal level $V_{CC}/2$. Since this level is just the middle level between the high and low level fed to the pad P, the possibility of malfunctioning due to the noise reaching the pad P is minimized.

If, in this way, incorrect reading of the input signal can be prevented even in the event of a moderate input drop, then the layout within the IC chip can be worked out with less strict restrictions concerning adjacent placement of input sections and noise-causing circuits. This makes it possible to reduce the chip area, and thereby achieve a reduction in the size as well as in the cost of the FDD apparatus as a whole.

In any embodiment of the present invention, including the one described heretofore with reference to FIG. 1, whether the resistors R1 and R2 and the protection diodes Di1 and Di2 are actually used or not is determined in accordance with the type of the circuit that is actually connected to the pad P. The threshold voltage of the inverter may be varied in any commonly-practiced way other than is described above. The threshold voltage of the inverter may even be varied just in accordance with the variation of the supply power.

Figure 2:
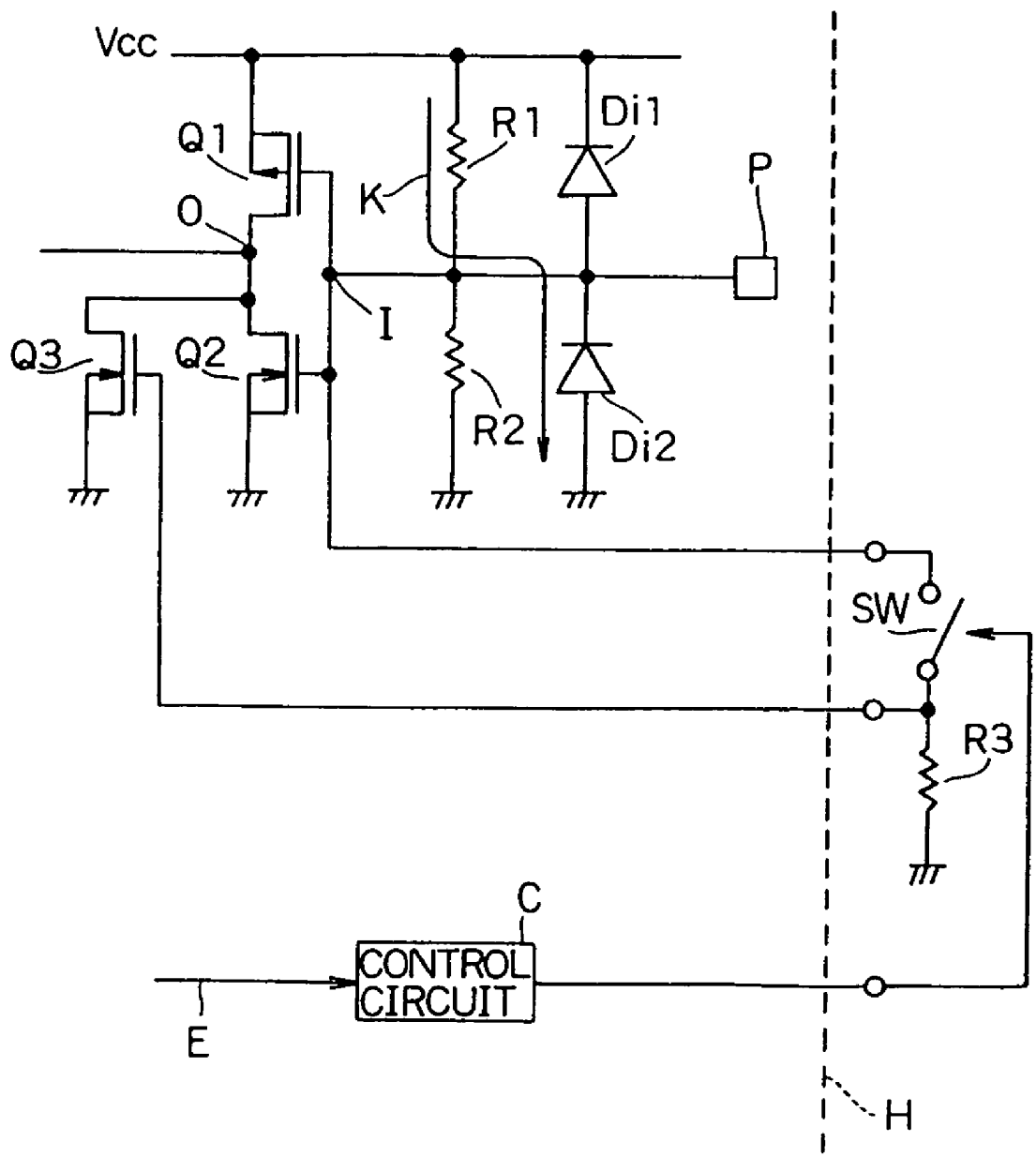
FIG. 2 is a circuit diagram of another example of the configuration of the input section of the interface driver circuit employed in an FDD apparatus embodying the invention.
Figure 3:
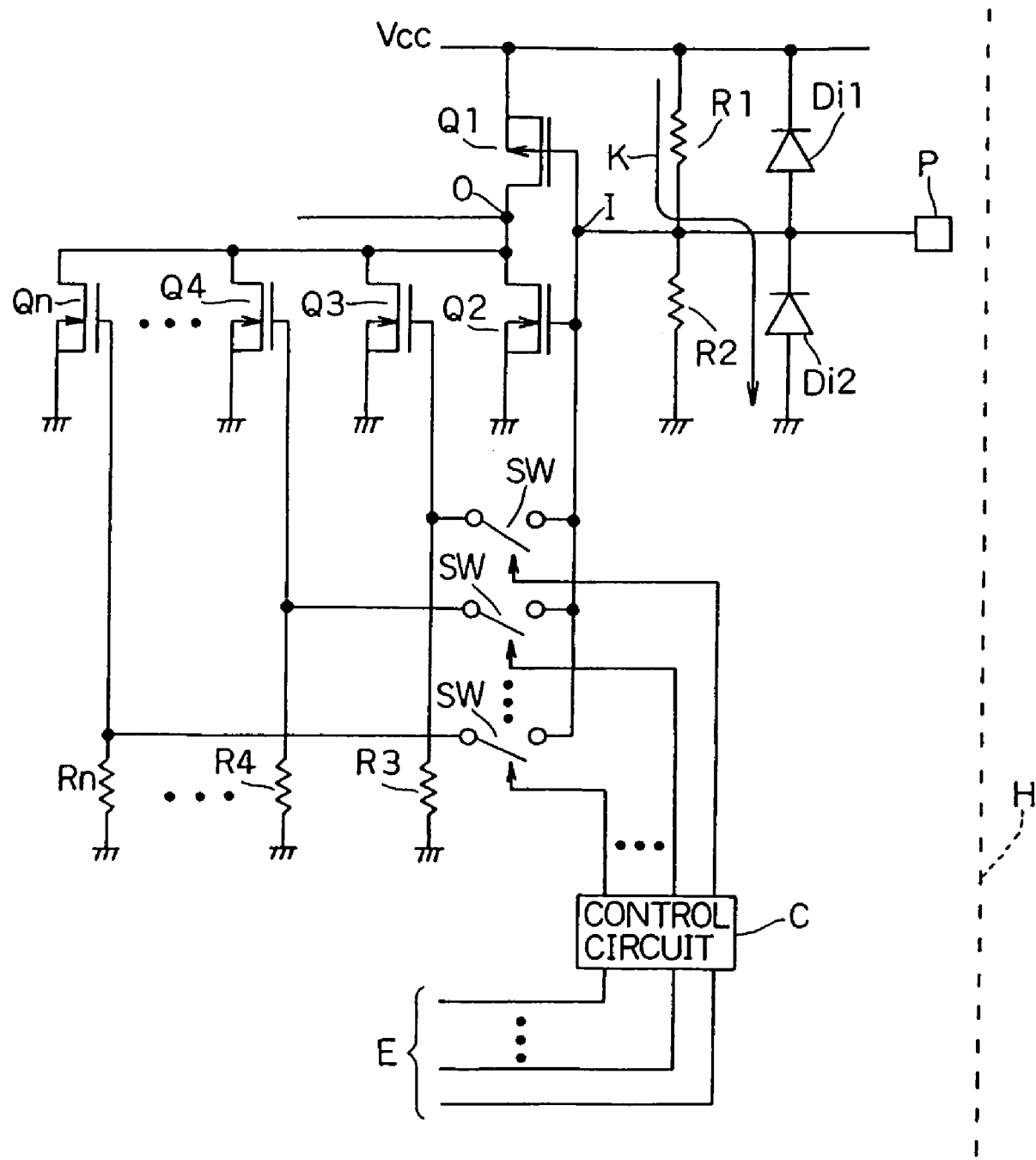
FIG. 3 is a circuit diagram of still another example of the configuration of the input section of the interface driver circuit employed in an FDD apparatus embodying the invention.

It is also possible to connect the switch SW and the resistor R3 externally to the IC, as shown in FIG. 2. This makes it possible to set the input threshold voltage at any desired level. Although the inverter shown in FIG. 1 includes two NMOS transistors, it is also possible to use three or more NMOS transistors therein by adopting a configuration as shown in FIG. 3. This makes it possible to set the threshold voltage of the inverter at any of three or more predetermined levels, and thereby cope with cases where there are a plurality of noise-causing circuits whose operation causes input drops of different degrees. Note that, in FIG. 3, the control circuit C is so configured as to turn on or off a plurality of switch circuits SW in accordance with a plurality of enable signals E.

Figure 4:
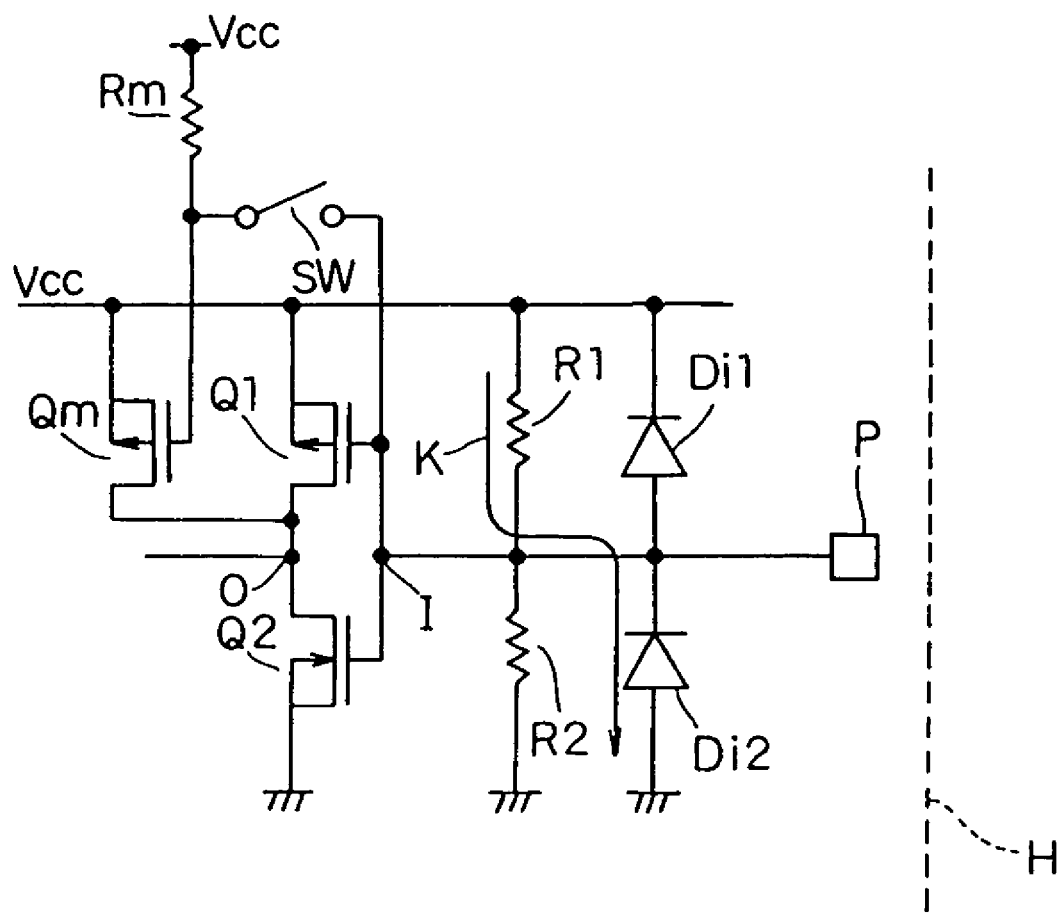
FIG. 4 is a circuit diagram of a further example of the configuration of the input section of the interface driver circuit employed in an FDD apparatus embodying the invention.

In cases where the operation of a noise-causing circuit causes a rise, rather than a drop, in the input to the inverter, a plurality of PMOS transistors are provided so that the use or disuse of the individual PMOS transistors is switched in accordance with whether a noise-causing circuit is enabled or disabled. This makes it possible to raise the threshold voltage of the inverter when the noise-causing circuit is enabled. For example, as shown in FIG. 4, the gate of a PMOS transistor Qm is connected through a switch circuit SW to the input terminal I of the inverter and simultaneously through a resistor Rm to the supply voltage $V_{CC}$, and the switch circuit SW is turned on or off in accordance with whether a noise-causing circuit is enabled or disabled (i.e. when the noise-causing circuit is enabled, the switch circuit SW is turned on, and, when the noise-causing circuit is disabled, the switch circuit SW is turned of).

As described heretofore, according to the present invention, in a semiconductor device or in a disk drive apparatus, it is possible to reduce the possibility of malfunctioning and simultaneously reduce the size and cost thereof.

What is claimed is:

1. A disk drive apparatus using a semiconductor device, the semiconductor device comprising:
   an output circuit;
   an input circuit that has an input threshold value and that feeds out output signals representing different states respectively depending on whether or not a value of an input signal fed thereto is higher than the input threshold value;
   a control circuit for controlling the output circuit and for processing an output signal fed from the input circuit; and
   a threshold control circuit for varying the input threshold value in accordance with an operation state of the output circuit,
   wherein, when a change in the value of the input signal is caused in accordance with the operation state of the output circuit, the threshold control circuit changes the input threshold value so as to offset the change in the value of the input signal.

2. A disk drive apparatus as claimed in claim 1,
   wherein the disk drive apparatus is connected to an external host apparatus and further comprises:
   a read/write head for writing and reading data to and from a disk-shaped recording medium; and
   a stepping motor for transporting the read/write head radially across the recording medium, wherein the output circuit is at least one of an interface driver circuit that feeds out data to the host apparatus, a read/write circuit that is connected to the read/write head, and a stepping motor driver circuit, and the input circuit is the interface driver circuit to which data is fed from the host apparatus.

3. A disk drive apparatus as claimed in claim 2,
   wherein the control circuit is connected to at least one of the interface driver circuit, the read/write circuit, and the stepping motor driver circuit.

4. A disk drive apparatus as claimed in claim 1, wherein an inverter circuit constitutes the input circuit, and the input threshold value is varied by the threshold control circuit by varying the number of transistors constituting the inverter circuit.

5. A disk drive apparatus as claimed in claim 4, wherein said inverter circuit comprises:
   a P-channel MOSFET having a gate connected to an input terminal, having a drain connected to an output terminal, and having a source connected to a supply power potential;
   a first N-channel MOSFET having a gate connected to the input terminal, having a drain connected to the output terminal, and having a source connected to a ground potential; and
   a second N-channel MOSFET having a drain connected to the output terminal and having a source connected to the ground potential, a gate of said second N-channel MOSFET being connected through a switch to the input terminal and also connected through a resistor to the ground potential, said switch being controlled to be turned on or off by said threshold control circuit.

6. A disk drive apparatus as claimed in claim 4, wherein said P-channel MOSFET, said first N-channel MOSFET, and said second N-channel MOSFET are formed within the semiconductor device, and said switch and said resistor are externally connected to the semiconductor device.

7. A disk drive apparatus as claimed in claim 4, wherein said inverter circuit comprises:
   a P-channel MOSFET having a gate connected to an input terminal, having a drain connected to an output terminal, and having a source connected to a supply power potential;
   a first N-channel MOSFET having a gate connected to the input terminal, having a drain connected to the output terminal, and having a source connected to a ground potential; and
   a plurality of second N-channel MOSFETs each having a drain connected to the output terminal and having a source connected to the ground potential, gates of the plurality of second N-channel MOSFETs being individually connected through respective switches to the input terminal and also connected through respective resistors to the ground potential, said switches being controlled to be turned on or off by said threshold control circuit.

* * * * *